United States Patent [19]

Ito et al.

[11] Patent Number: 4,980,307
[45] Date of Patent: Dec. 25, 1990

[54] PROCESS FOR PRODUCING A SEMICONDUCTOR DEVICE HAVING A SILICON OXYNITRIDE INSULATIVE FILM

[75] Inventors: Takashi Ito, Kawasaki; Takao Nozaki, Yokohama, both of Japan

[73] Assignee: Fujitsu Limited, Kawasaki, Japan

[21] Appl. No.: 401,489

[22] Filed: Aug. 30, 1989

Related U.S. Application Data

[60] Continuation of Ser. No. 315,235, Feb. 23, 1989, abandoned, which is a continuation of Ser. No. 195,385, May 10, 1988, Pat. No. 4,786,856, which is a continuation of Ser. No. 822,278, Jan. 24, 1986, abandoned, which is a division of Ser. No. 372,720, Apr. 28, 1982, Pat. No. 4,621,277, which is a continuation of Ser. No. 48,073, Jun. 13, 1979, abandoned.

[30] Foreign Application Priority Data

Jun. 14, 1979 [JP] Japan .................................. 54-71618
Jun. 15, 1979 [JP] Japan .................................. 54-72654

[51] Int. Cl.⁵ .......................................... H01L 21/265
[52] U.S. Cl. ........................ 437/40; 148/DIG. 112; 148/DIG. 114; 437/235; 437/242
[58] Field of Search ................ 148/DIG. 30, 32, 35, 148/43, 45, 98, 112, 114, 117, 118; 437/18, 40, 41, 42, 235, 238, 239, 241, 242, 170, 172, 247, 920, 978

[56] References Cited

U.S. PATENT DOCUMENTS

| | | | |
|---|---|---|---|
| 3,385,729 | 5/1968 | Larchian | 437/62 |
| 3,520,722 | 7/1970 | Scott | 437/241 |
| 3,549,411 | 12/1970 | Bean et al. | 427/39 |
| 3,789,061 | 3/1974 | Yamazaki | 437/241 |
| 3,917,495 | 11/1975 | Horn | 148/787 |
| 3,924,024 | 12/1975 | Naber et al. | 427/95 |
| 3,967,981 | 7/1976 | Yamazaki | 148/1.5 |
| 4,051,273 | 9/1977 | Abbas et al. | 427/86 |
| 4,056,642 | 11/1977 | Saxena et al. | 357/67 |
| 4,066,037 | 1/1978 | Jacob | 118/49.1 |
| 4,113,515 | 9/1978 | Kooi et al. | 148/1.5 |
| 4,238,436 | 12/1980 | Hill et al. | 264/81 |
| 4,298,629 | 11/1981 | Nozaki et al. | 427/39 |
| 4,331,710 | 5/1982 | Nozaki et al. | 427/94 |
| 4,436,770 | 3/1984 | Nishizawa et al. | 427/255.3 |

FOREIGN PATENT DOCUMENTS

| | | |
|---|---|---|
| 1544287 | 7/1969 | Fed. Rep. of Germany . |
| 1644012 | 9/1970 | Fed. Rep. of Germany . |
| 1489188 | 3/1978 | Fed. Rep. of Germany . |
| 2233836 | 10/1974 | France . |
| 2313770 | 12/1976 | France . |
| 1420557 | 1/1976 | United Kingdom . |
| 2004693 | 4/1979 | United Kingdom . |

OTHER PUBLICATIONS

Bassous, "Fabricating Submicrometer Silicon Devices", IBM TDB, vol. 15, No.6, Nov. 1972 pp. 1823–1825.
Ackermann et al., "Process for Deposition of Oxynitride", IBM TDB, vol. 15, No. 12, May 1973, p. 3888.
Kasprzak et al., "Pseudostable MNOS Structures", J. Electrochem. Soc., vol. 124, No. 10, Oct. 1977, pp. 1631–1634.

(List continued on next page.)

*Primary Examiner*—Olik Chaudhuri
*Assistant Examiner*—William Bunch
*Attorney, Agent, or Firm*—Staas & Halsey

[57] ABSTRACT

An insulative film, such as $SiO_2$, $Si_3N_4$ and PSG films, for example, is commonly used the passivation film or gate electrode of MISFETs. Stability of the insulative films during the production or operation of the semiconductor devices is enhanced by providing an insulative film which is formed by nitridation, for example, in an $NH_3$ gas, of an $SiO_2$ film, preferably a directly thermally oxidized film of silicon. The insulative film according to the present invention is used for a gate insulation film in MISFETs, a capacitor or passivation film for semiconductor devices, and as a mask for selectively forming circuit elements of semiconductor devices. The process for forming the insulative film may comprise successive nitridation, oxidation and nitridation steps.

6 Claims, 11 Drawing Sheets

OTHER PUBLICATIONS

Choudhari, "Threshold Voltage Degradation of MNOS FET Devices", J. Electrochem. Soc., vol. 125, No. 10, Oct. 1978 pp. 1657–1660.

Kooi et al., "Formation of Silicon Nitride at Si–SiO$_2$ Interface ...," J. Electrochem. Soc., Jul. 1976, vol. 123, No. 7, pp. 1117–1120.

C. J. Dell'Oca, "Properties of Anodic Films Formed in the Anodization of Silicon Nitride," Journal of the Electrochronical Society, vol. 120, No. 9, pp. 1225–1230, Sep., 1973.

Myron J. Rand et al., "Silicon Oxynitride Films from the No–NH$_3$SiH$_4$ Reaction," Journal of Electrochronical Society: Solid State Science and Technology, vol. 120, No. 3, pp. 446–453, Mar. 1973.

Takashi Ito et al., "Direct Thermal Nitridation of Silicon Dioxide Films in Anhydrous Ammonia Gas," vol. 127, Journal of Electrochronical Society: Solid State Science and Technology, No. 9, pp. 2053–2057, Sep., 1980.

P. C. Li et al., "Gate Dielectric Strucuture for Field-Effect Transistors," IBM Technical Disclosure Bulletin, Jan., 1975, vol. 17, No. 8. p. 2330.

M. R. Poponiak et al., "Formation of Thick Si$_3$N$_4$ or Si$_x$O$_y$N$_z$ on Si Substrate by Anodnitridization," IBM Technical Disclosure Bulletin, Aug. 1976, vol. 19, No. 3, p. 905.

Judith A. Nemetz, "Thermal Nitridation of Silicon and Silicon Dioxide for Thin Gate Insulators," Solid State Technology, Feb. 1983, pp. 70–85.

F. H. P. M. Habraken et al., "Thermal Nitridation of Monocrystalline Silicon, Polycrystalline Silicon and Silicon Dioxide Films," Phillips Research Laboratories, 1983, vol. 38, pp. 19–25.

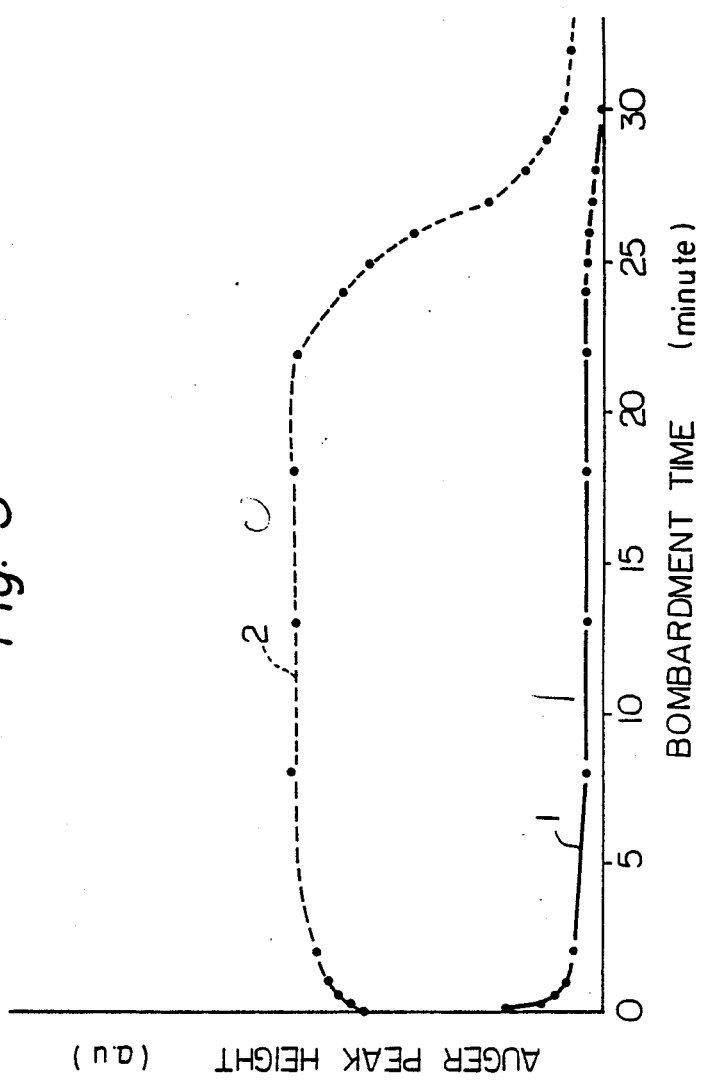

PROCESS FOR PRODUCING A SEMICONDUCTOR DEVICE HAVING A SILICON OXYNITRIDE INSULATIVE FILM

This is a continuation of copending application Ser. No. 315,235 filed on Feb. 23, 1989, abandoned, which is a continuation of Ser. No. 195,385 filed on May 10, 1988, now U.S. Pat. No. 4,786,856, which is a continuation of Ser. No. 822,278, filed Jan. 24, 1986, abandoned, which is a division of Ser. No. 372,720, filed Apr. 28, 1982, now U.S. Pat. No. 4,621,277, which is a continuation of Ser. No. 048,073, filed June 13, 1979, abandoned.

BACKGROUND OF THE INVENTION

1. Field of Invention

The present invention related to a semiconductor device having an insulative film and to a process for producing the same. The present invention relates more specifically to employment of a novel insulative film for a gate insulation film for MISFETs, for the dielectric element of a capacitor, for a passivation film for semiconductor devices, and for a mask for selectively forming circuit elements of semiconductor devices, and as well as to a novel process for forming the insulative film in the production of semiconductor devices.

2. Description of Prior Art

A. General

The material used as an insulative film in a silicon semiconductor device in the prior art includes silicon dioxide ($SiO_2$), silicon nitride ($Si_3N_4$) and silicon oxynitride ($SiO_xN_y$). The silicon dioxide is formed by a thermal oxidation of the silicon substrate or CVD process and is inherently not dense. The silicon nitride is formed by CVD or a direct nitridation of silicon. The silicon oxynitride is formed by a CVD process using $NH_3$, $O_2$ and $SiH_4$ gases.

The insulative film previously used in a semiconductor device having a silicon substrate also includes a double film, wherein alumina ($Al_2O_3$), silicon nitride or a mixture of $Al_2O_3$ and $Si_3N_4$ is applied or laminated on the silicon dioxide film. The known insulative single or double film is, however, unstable during the production or operation of the semiconductor device, and does not have a dense structure. Furthermore, it is inevitable that an interface between the insulation film and the silicon substrate is caused by the CVD process.

In the known CVD process of silicon oxynitride, monosilane ($SiH_4$), ammonia ($NH_3$) and oxygen ($O_2$) are brought into reaction with each other at a temperature of, for example, 700° C. The molar ratio of ammonia with respect to oxygen may be varied or increased gradually during the CVD period. However, the silicon oxynitride produced by this CVD process disadvantageously possesses structural defects. The inventors of the present invention believe that the structural defects are caused by the fact that intermediate products of the CVD reaction are incorporated into the insulation film.

A further disadvantage of the CVD process mentioned above is that it is difficult to precisely adjust the thickness of the silicon oxynitride film, and to form a film having a thickness of from 100 angstroms or less.

B. Surface Passivation

It is well known in the field of semiconductor devices to use silicon dioxide ($SiO_2$) as an insulative film on a semiconductor silicon substrate. Since the semiconductor device is required to operate both reliably and stably for a long period of time, the contamination of the semiconductor substrate surface, which is believed to be the ma3or reason for the deterioration of reliability, must be prevented by covering the surface of the semiconductor substrate with silicon dioxide film. In this regard, silicon dioxide is the insulative material which is most frequently used for such covering, namely for surface passivation.

It is also known that a single film of silicon dioxide cannot effectively prevent the surface of the semiconductor substrate from being contaminated, which is caused by contaminants, such as moisture, sodium ions, etc., from outside of the semiconductor device. Accordingly, an upper film of alumina ($Al_2O_3$) is overlapped on a lower film of silicon dioxide, so as to cover with the upper film the silicon dioxide film which is not highly resistant against the contamination mentioned above. Instead of the alumina film, a phosphorus glass layer, a boron glass layer or a lead glass layer may be formed on the silicon dioxide film. The formation of the phosphorus glass layer or phosphorus treatment can be simply carried out and effectively passivates the semiconductor surface. Although the phosphorus treatment is most frequently employed in the industrial production of semiconductor devices, the surface of the passivation film, on which the phosphorus is impregnated, is disadvantageously hygroscopic and, hence, unstable.

It is also known that the silicon dioxide film formed by directly oxidizing the silicon substrate is superior to an insulative film directly deposited on the silicon substrate by the CVD process. This is because, the CVD process involves a contamination of the interface between the film and substrate due to vapor sources.

C. Gate Insulation Film of MISFET

In the MIS (metal-insulator-semiconductor) type FETs (field effect transistors), the gate insulation films conventionally used include a silicon dioxide film, a double structure film composed of a lower silicon dioxide layer and an upper silicon nitride or oxynitride layer, and a silicon oxide film, which is subjected to the phosphorus treatment mentioned in the item entitled Surface Passivation, above. The silicon dioxide film used for the gate insulation film of MISFETs is formed by thermal oxidation of silicon. However, since silicon dioxide is not inherently dense, MISFETs with excellent properties and large scale integrated circuits cannot be produced from the silicon dioxide film. In the double structure film mentioned above, structural defects are liable to form at the interface of the two layers, with the result that the structural defects act as capturing centers of carriers. Due to the structural defects, the operation of the MISFETs having a gate insulation film of the double structure becomes unstable. When a high electric potential amounting to $10^6$ V/cm is applied to the gate insulation film of the MISFETs, the instability problem due to the structural defects is serious, because the threshold voltages ($V_{TH}$) of the gate are scattered and vary during the operation of the MISFETs.

When the conventional silicon dioxide film, which is subjected to the phosphorus treatment, is subjected to a high electric potential, polarization is induced in the silicon dioxide film, with the result that the electric potential of the semiconductor substrate surface is varied. This variation of the electric potential results in instability of the MISFETs.

D. Mask against Diffusion

Diffusion of impurities into a semiconductor substrate is an indispensable step for producing a semiconductor device. Diffusion is frequently carried out by a selective diffusion technique in which an insulative mask is used.

It is known that a thermal oxidation film of silicon dioxide ($SiO_2$) can be used for the diffusion mask, but that such film cannot exhibit masking effects against particular kinds of impurities, for example, gallium or boron. With regard to gallium, the gallium atoms enter the silicon dioxide film and then the underlying semiconductor substrate. The impurity boron, which is diffused under a hydrogen atmosphere into the semiconductor substrate, also enters the silicon dioxide film through the auxiliary action of the hydrogen. The thermal oxidation film of silicon dioxide cannot, therefore, achieve the selective diffusion of gallium and boron.

It is also known that the film of silicon nitride ($Si_3N_4$) formed by the CVD process can be used for the diffusion mask. However, a thin silicon nitride film which is formed by the CVD process on the silicon substrate lacks uniformity, while a thick silicon nitride film is liable to generate thermal stress or cracks between the semiconductor substrate and the silicon nitride film.

E. Conductor deposited on Insulative Film

In the production of semiconductor devices, metallic material is frequently deposited on an insulative film for the purposes of, for example, bonding metallic leads on a semiconductor substrate provided with an insulative film and producing the multi-layer wiring structure of integrated circuits. Since silicon dioxide ($SiO_2$) is frequently used as the insulative film metals having superior adhering property with the silicon dioxide, such as aluminum (Al), molybdenum (Mo), polycrystalline silicon, chromium (Cr) and titanium (Ti), are used for the conductor material. The more the metals are oxidation reactive, the higher the bonding strength between the insulative film and the metal. At the interface between the highly oxidation-reactive metal film and the silicon dioxide film a transitional layer is created after the deposition of the metal film in which layer the metal is oxidized by the oxygen of the silicon oxide. It is believed by experts in the field of semiconductor technology that the adhering property of the metals mentioned above is increased by the transitional layer. However, insulative properties of the thin silicon dioxide film are disadvantageously deteriorated due to the reaction between the metal and silicon dioxide, namely, by the removal of oxygen from the silicon dioxide film.

F. Capacitor of Semiconductor Device

The conventional capacitor for the semiconductor devices had a structure in which an insulative film was deposited on the metal or semiconductor substrate and was coated by a counter electrode made of metal, etc. Since the capacitor for the semiconductor devices is required to be compact and inexpensive, and to have a large capacitance, a film made of silicon dioxide ($SiO_2$), alumina ($Al_2O_3$) and silicon nitride ($Si_3N_4$) was conventionally used for the insulative film. This is because silicon dioxide can be produced simply by heating the semiconductor silicon substrate in an oxidizing atmosphere, and the so produced silicon dioxide film can be thin and is free from such defects as pinholes. However, the thermally oxidized film of silicon is disadvantageous because of the fact that such film has a low dielectric constant, is not highly resistant to emission of radiation and is not highly resistant to contamination from outside the semiconductor device.

The alumina ($Al_2O_3$) of the above mentioned film is generally formed by the CVD process or an anodic oxidation process and exhibits a high dielectric constant. However, when the alumina film is thin, a leak current through the film is too large to allow control of the loss of current to an acceptable level.

The silicon nitride ($Si_3N_4$) of the above mentioned film can be formed by a thermal nitridation of silicon, but the thickness of such nitride film is limited, so that the maximum allowable voltage of such nitride film raises a problem.

It is also known that films of silicon mono-oxide (SiO), tantalum oxide ($Ta_2O_5$) and titanium dioxide ($TiO_2$) can be used for the capacitor. However, the qualities of the films of these oxides are poor.

SUMMARY OF THE INVENTION

It is, therefore, an object of the present invention to provide a novel, dense insulation film for semiconductor devices which does not cause the disadvantages of the semiconductor devices resulting from the properties of the conventional insulation film.

It is also an object of the present invention to improve the conventional passivation film, so that the density of the passivation film is enhanced and, further, contamination at the boundary between such film and a semiconductor silicon substrate is prevented.

It is a further object of the present invention to reduce the structural defects of the conventional gate insulation film of MISFETs, which defects cause the polarization of carriers in the film and the capturing centers of the carriers.

It is also an object of the present invention to provide a diffusion mask for selective diffusion of impurities, which mask is thin and can be firmly bonded to a semiconductor silicon substrate.

It is yet another object of the present invention to provide a compact capacitor of semiconductor devices having a large capacitance, which capacitor has improved stability and homogeneity can be mass-produced.

It is still another object of the present invention to provide novel processes for producing a film of silicon oxynitride to be used in semiconductor devices.

A semiconductor device according to the present invention comprises a semiconductor silicon substrate and an insulation film formed on the semiconductor silicon substrate, wherein the insulation film is formed by a nitridation of at least a surface portion of a silicon dioxide film under a nitridation atmosphere containing nitrogen atoms. The insulation film according to the present invention may be a silicon nitride or a so called silicon oxynitride, which is a silicon dioxide in which oxygen atoms are replaced, although not stoichiometrically, by nitrogen atoms. The silicon oxynitride according to the present invention is distinguished from the known silicon oxynitride, which has been formed by a CVD process using $NH_3$, $SiH_4$ and $O_2$ gases. The thermal oxidation film of silicon is subjected to nitridation according to the present invention. The silicon oxynitride film accordin.g to the present invention is distinguished from the known, double structure film of a lower, silicon dioxide layer and an upper, silicon nitride layer, because the silicon nitrrde layer is deposited on the silicon dioxide l.ayer in the known structure, while the silicon dioxide layer is at least partly nitrided or impregnated with nitrogen in the present invention. Accordingly, the insulation film according to.the present invention does not have such disadvantages as the formation of structural defects therein and contamination of the interface between such a film and the semiconductor silicon substrate.

The insulation film according to the present invention may be a silicon nitride film, but is distinguished from the silicon nitride film formed by a thermal direct nitridation of the silicon substrate. In the direct thermal nitridation of silicon, the silicon is heated to an elevated temperature in an ammonium atmosphere, and nitrogen atoms are diffused from the atmosphere into the substrate. The rate determining step in the direct thermal nitridation of silicon is, therefore, the diffusion step and, as a result, the growth rate of the nitride film is reduced with the increase in thickness of the growing film, which impedes the diffusion of the nitrogen atoms. Accordingly, it is difficult to form a nitride film having a thickness of 100 angstroms or more by the direct thermal nitridation of silicon.

BRIEF DESCRIPTION OF THE DRAWINGS

The present invention is explained further in detail with reference to hte drawings, wherein:

FIGS. 2 and 3 are graphs similar to that of FIG. 1;

FIGS. 7 through 12 are cross-sectional views of a semiconductor silicon substrate and various elements of a MISFET which are successively formed on;

DESCRIPTION OF THE PREFERRED EMBODIMENTS

Figure 1:
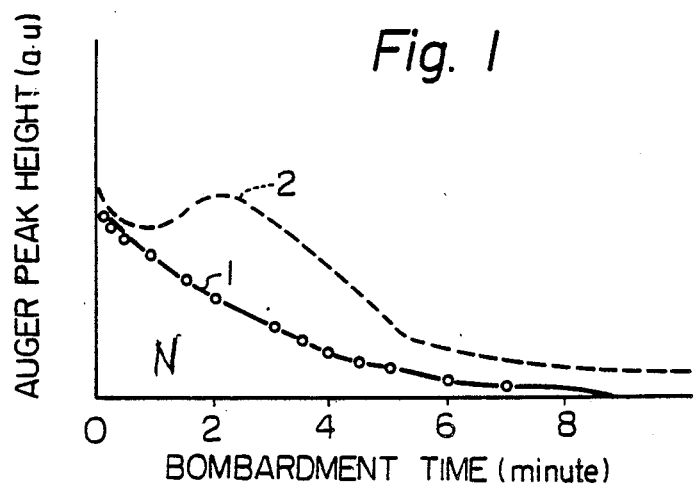
FIG. 1 is a graph indicating a peak value of Auger analysis of an insulating film which is subjected to surface removal by a sputtering method.

A. Process for Formation of Insulation Film

A process is known for forming a silicon dioxide film by the thermal oxidation of a semicondutor silicon substrate, which comprises a step of heating the substrate to an elevated temperature of from 600 to 1200° C. in an oxidizing atmosphere of, for example, oxygen or water. Depending upon the purpose of the silicon dioxide film, the thickness of the film is selected in the range of from 30 to 20000 angstroms.

The thermal oxidation of silicon is suitable for preventing the increase of electric charges on the surface of the silicon substrate to a level of more than $10^{12}$ cm$^{-2}$.

The nitridation process of silicon dioxide film according to the present invention may comprise a step of heating the semiconductor silicon substrate and the silicon dioxide film formed on the substrate to a temperature.of from 900 to 1300° C., preferably from 1000 to 1200° C., in an atmosphere containing nitrogen atoms. Such atmosphere comprises preferably at least one gas selected from ammonia ($NH_3$) and hydrazine ($N_2H_4$). The nitridation atmosphere may also contain an inert gas such as argon, and residual gases such as oxygen. The flow rate of the gas should be from 100 to 50000 cc/minute. The nitridation time should be at least 1 minute. The maximum nitridation time is dependent upon the extent of the desired nitridation. Namely, the nitridation time is increased when nitrogen is to be introduced to a large depth in the silicon dioxide film, and/or when the molar ratio of nitrogen to oxygen in the nitrided film is to be increased. It is possible that nitrogen atoms in the nascent state are formed from the decomposition of the ammonium or hydrazine, which atoms participate in the formation of the silicon oxynitride. Experiments in teh development of the present invention have shown that no silicon oxynitride was formed by heat treatment using nitrogen gas and that, it is essential to use gaseous compounds, such as $NH_3$ and $N_2H_4$, for the nitridation atmosphere.

The nitridation process of the silicon dioxide film according to the present invention may comprise the steps of forming a film essentially of silicon nitride on a semiconductor silicon substrate, by subjecting this substrate to a direct thermal nitridation of the silicons, then oxydizing a portion of the film mentioned above, and subsequently heating the semiconductor silicon substrate in an atmosphere which contains nitrogen atoms, thereby subjecting at least a portion of the oxidized surface of the semiconductor silicon substrate to direct nitridation.

The process for forming a direct thermal nitride film of silicon comprises a step of heating a silicon semiconductor substrate in a nitrogen containing atmosphere to a temperature of from 900 to 1300° C., preferably from 1000 to 1200° C. for a period of from 0.01 to 100 hours. The nitrogen containing atmosphere may comprise nitrogen or a nitrogen compound, such as ammonia or hydrazine ($N_2H_4$). The nitrogen compound is preferably ammonia. The direct thermal nitride film of silicon preferably has thickness of from 20 to 100 angstroms, more preferably from 30 to 50 angstroms. Such a nitride film can be formed by using a nitridation atmosphere in which oxidant impurities, such as oxygen, water, carbon dioxide, etc., are reduced to a level of less than 100 ppm and by adjusting the nitridation temperature to a of 1200 to 1300° C.

It is preferable to completely clean the silicon substrate prior to the nitridation, by degreasing the silicon substrate in an organic solvent, boiling in a acid solution, preferably sulfuric and nitric acid, and etching in hydrofluoric acid. Prior to forming the direct thermal nitride film of silicon, it is preferable to heat the silicon substrate in an inert gas atmosphere at a temperature of from 900 to 1300° C.

The oxidation step comprises heating the semiconductor silicon substrate provided with the nitride film to a temperature of from 500 to 1300° C., preferably from 900 to 1200° C., in an oxidizing atmosphere of oxygen or water. The film consisting essentially of silicon nitride is gradually changed to silicon oxide by oxygen atoms, which diffuse from the surface to the interior of the film. Silicon oxide or silicon oxynitride is, therefore, formed on the oxidized surface of the film. In the oxidation step mentioned above, the thickness of the oxidized silicon nitride film is increased because the oxide film grows to a thickness of from 30 to 190 angstroms, preferably from 50 to 90 angstroms. The total thickness of the silicon nitride and the oxydized film is increased from the thickness of the nitride film directly after the thermal nitridation of silicon.

The final nitridation step of the oxidized surface of the nitride film is carried out in the same manner as in the nitridation of the silicon dioxide film, explained hereinabove. The nitride film is usually formed, however, a film composed of a mixture of the oxide and nitride is formed when the nitridation time is short.

Nitrogen atoms can easily diffuse through the upper oxidized film of the silicon nitride and reach the lower nitride film of silicon, which is formed by the first step of direct thermal nitridation and which is in contact with the semiconductor silicon substrate. Since the thickness of the lower nitride film is reduced as compared with that directly after the direct thermal nitridation of silicon, the nitrogen atoms can further diffuse through the lower nitride film onto the surface of the semiconductor silicon substrate. A new silicon nitride film is, therefore, formed on the surface of the semiconductor silicon substrate. Furthermore, the oxide film formed by the direct thermal nitridation step is gradually converted to silicon nitride film during the final nitridation step. The silicon nitride film after the final nitridation step is advantageously dense and has a thickness in the range of from 30 to 180 angstroms, preferably from 60 to 140 angstroms. The silicon nitride film having the thickness mentioned above is particularly suitable for the gate insulation film of MISFETs.

An advantageous nitridation process for a thermal oxidation film of silicon comprises step of heating the semiconductor silicon substrate and the silicon dioxide film formed thereon to an elevated temperature in an atmosphere of plasma gas which contains nitrogen atoms. The plasma gas atmosphere can be generated from a nitrogen containing gas or gases. Such gas is, preferably, ammonia, hydrazine or nitrogen. The nitrogen-containing gas can be mixed with hydrogen, hydrogen chloride or chlorine gases. The plasma gas may be generated by heating the source gas under a reduced pressure of from 0.01 to 10 Torr by means of an electric discharge. An electric charge is induced in the space in which the source gas is confined, by applying a high frequency current of from 50 to 1000 KHz and a voltage of from 1 KV to 100 KV. The nitridation process using the plasma gas is advantageous because various kinds of gases can be used and, further, the heating temperature is low, i.e. in the range of from 800 to 1300° C., preferably from 800 to 1100° C. The nitridation time using the plasma gas is reduced compared to that when using non plasma gases.

B. Properties of Insulation Films

The insulation films comprising the silicon oxynitride or the silicon nitride according to the present invention are not liable to be contaminated by impurities, such as moisture, and sodium and potassium ions. The surface state density ($N_{ss}$) of the insulation film is decreased considerably by the nitridation of silicon dioxide to a level of approximately $5 \times 10^{11}$ to $1 \times 10^{10}$/cm$^2$ at a silicon surface potential of 0.3eV. It appears the because of a decrease in the drift of sodium ions due to the nitridation, the behaviour of the capacitance change depending upon the voltage applied to the insulation film is decisively influenced by injection of carriers into a trap level, which is present in the proximity of the interface between the silicon substrate and the insulation film comprising the silicon dioxide.

In the nitridation by the non plasma gas, it is preferable to select the heating time in the range of from 1 to 5 hours and the heating temperature in the range of from 1000 to 1200° C., so as to provide the insulation film with a low $N_{ss}$. Also in the nitridation by the plasma gas, it is preferable to select the heating time in the range of from 1 to 5 hours and the heating temperature in the range of from 1000 to 1200° C., so as to provide the insulation film with a low $N_{ss}$.

Under a high electric potential, the insulation films according to the present invention do not exhibit such disadvantageous behavior as the movement of ions and the capturing phenomena of carriers in the film.

The insulation film comprising the silicon oxynitride and the silicon nitride, according to the present invention, have a high relative dielectric constant ranging from 4 to 5.3. Furthermore, the insulation films according to the present invention have a high breakdown voltage in the range of from 11 to 12 MV/cm. The breakdown voltage is increased as the nitridation time increases.

The silicon oxynitride film is highly resistant against etching solutions used in the production of semiconductor devices, such as hydrofluoric acid, ammonium fluoric acid or their mixed solution. The resistance against etching solution is increased with an increase in the nitridation time.

The insulative film, which is formed by a nitridation of the thermal oxidation of the silicon substrate, has such a structure that this oxidation film is gradually converted to silicon oxynitride from the surface to the interior of this film. In other words, at least an upper surface of the insulative film comprises a silicon oxynitride, and the nitrogen content of the silicon oxynitride is gradually decreased from the surface to the interior thereof. Accordingly, the insulative film according to the present invention is dense and includes no structural defects, which are liable to form at the interface of the laminated structure of two different kinds of layers.

The insulative film, which is formed by successive direct thermal nitridation, oxidation and nitridation steps, may have a structure different from that described above, but it is dense and includes no structural defects.

The molar ratio of nitrogen to oxygen in the silicon oxynitride generally ranges from 1:10 to 10:1.

C. Employment of the Insulation Films as Various Elements of the Semiconductor Devices.

The insulative films are formed according to the present invention by the nitridation of at least a portion of the thermal oxidation film of silicon or of the oxidized silicon nitride film. These films present no such inconveniences as contamination of the interface between the semiconductor substrate and the film due to the formation of the film, and polarization of carriers in the films caused by the electric field. Property variation of the insulative films due to movable ions is favorably suppressed by the nitridation of the silicon dioxide.

Because of the facts mentioned above, the insulative films according to the present invention are suitable for use as a passivation film of a semiconductor device and a gate insulation film of a MISFET. The passivation film should have a thickness of from approximately 1000 to 20000 angstroms, preferably from 3000 to 10000 angstroms. The thermal oxidation film of the silicon substrate to be subjected to the nitridation should have a thickness of from approximately 50 to 20000 angstroms, preferably from 100 to 10000 angstroms. The nitridation time of the silicon dioxide film should be from approximately 1 to 600 minutes in plasma and non plasma atmospheres.

When a dense passivation film in the range of from approximately 30 to 180 angstroms is desired, the direct thermal nitridation, thermal oxidation and nitridation of the silicon substrate should be performed successively. The direct thermal nitridation should be performed in such a manner that the nitride film grows to a thickness of from approximately 20 to 100 angstroms, preferably from 30 to 70 angstroms. The thermal oxidation time should be from approximately 0.01 to 100 hours, preferably from 0.1 to 10 hours. The nitridation after the thermal oxidation step should be carried out from approximately 0.01 to 100 hours, preferably from 0.1 to 10 hours.

Since an electrode or wiring, etc., is usually formed on the top surface of the semicondutor devices not in a thermal oxidation film of the silicon substrate but on a silicon dioxide film which is deposited on such top surface by a CVD, sputtering or vacuum evaporation process, such a conventionally formed oxide also may be subjected to the nitridation to be used for the passivation film. The passivation films according to the present invention are highly resistant to contamination from the exterior of the semiconductor device, and enable long and stable operation of the semicondutor devices, with constant performance, even at high temperature.

The insulative films according to the present invention are also suitable for use as a gate insulation film of a MISFET. The gate insulation film should have a thickness of from approximately 30 to 3000 angstroms, preferably from 50 to 1000 angstroms. The thermal oxidation film of the silicon substrate to be subjected to the nitridation should have a thickness of from approximately 30 to 3000 angstroms, preferably from 100 to 1000 angstroms. The nitridation time of the silicon dioxide film should be from approximately 0.01 to 100 hours in a plasma or non plasma atmosphere.

When a dense gate insulation film in the range of from approximately 30 to 190 angstroms is desired, the direct thermal nitridation, thermal oxidation and nitridation of the silicon substrate should be performed successively. The direct thermal nitridation should be performed in such a manner that the nitride film grows to a thickness of from approximately 20 to 100 angstroms, preferably from 30 to 70 angstroms. The thermal oxidation time should be from approximately 0.01 to 100 hours, preferably from 0.1 to 10 hours. The nitridation after the thermal oxidation step should be carried out from approximately 0.01 to 100 hours, preferably from 0.1 to 10 hours.

The gate insulation film according to the present invention is highly resistant to contamination from the exterior of the semiconductor device. A semiconductor MISFET device with the insulating films formed by the nitridation of a direct oxidation film of a semiconductor silicon substrate according to the present invnetion has operated stably over a long period of time because of the excellent properties of the insulative films. In addition, the variation of the threshold voltage of the MISFETs is considerably lower during the operation thereof than that of the MISFETs having a conventional gate insulation film. Furthermore, no problems of a decrease in mutual conductance (gm) and an increase in the surface state density ($N_{ss}$) are presented during the operation of the MISFETs. The MISFETs according to the present invention are especially suitable for the elements of large scale integrated circuits.

When MISFETs are provided with the field insulation film made of the insulative films according to the present invention, the MISFETs are particularly advantageous in view of their stable operation. In order to produce such MISFETs, it is preferable to simultaneously subject the field and gate insulation films of silicon dioxide to nitridation. The nitride surface of the field insulation film is not removed when selectively removing the gate insulation film, so as to form windows for the source and drain of an MISFET. It is, however, possible to entirely remove the nitride surface of the field insulation film, and subsequently, to subject the field insulation film to nitridation.

In MISFETs a metal selected from the group consisting of aluminum, molybdenum, polycrystalline silicon, chromium and titanium, or especially the oxidation reactive metals, i.e., aluminum and molybdenum, can be advantageously used in combination with the insulative films according to the present invention for the gate insulation film. This is because these insulative films can effectively prevent the formation of a transitional layer. A transitional layer is formed by the reaction between the oxide film and the film of the metals mentioned above, while almost no such layer is formed by the reaction between the insulative films formed by the nitridation of the silicon oxide and the metals mentioned above. Since the surface of these insulative films is composed of silicon oxynitride, and thus contains oxides, a small amount of the transitional layer can be present due to the reaction between the oxides and the metals. However, the existence of oxides contribute to the enhancement of bonding strength of the metals with the insulative film. On the other hand, the existence of nitride in the insulative films prevents the unlimited increase of the transional layer.

In semiconductor devices, such metals as gold, aluminum and molybdenum, are used for wiring conductors and are deposited on an insulative material such as silicon dioxide. When the conductor and the silicon dioxide are heated to an elevated temperature, a reaction between the conductor and the silicon dioxide occurs. When such reaction causes an increase in the resistance and a property deterioration of the conductor, such reaction is undesirable and should be prevented. According to the insulative films of the present invention, the disadvantages mentioned above can be eliminated when heating the conductor and insulative material at a temperature ranging from 100° to 1200° C.

The insulative films for the gate insulation film and the underlying film of the conductor should have a thickness of from approximately 30 to 20000 angstroms, ferably from 100 to 10000 angstroms. The silicon oxide film to be subjected to the nitridation should have a thickness of from approximately 30 to 20000 angstroms, preferably from 100 to 10000 angstroms. The nitridation time of the silicon dioxide film should be from approximately 1 to 1000 minutes in plasma and non plasma atmospheres.

When dense insulative films in the range of from approximately 30 to 180 angstroms are desired, the direct thermal nitridation, thermal oxidation and nitridation of the silicon substrate should be performed successively. The direct thermal nitridation should be performed in such a manner that the nitride film grows to a thickness of from approximately 20 to 100 angstroms, preferably from 30 to 70 angstoms. The thermal oxidation time should be from approximately 0.01 to 100 hours, preferably from 0.1 to 10 hours. The nitridation after the thermal oxidation step should be carried out from approximately 0.01 to 100 hours, preferably from 0.1 to 10 hours.

When polycrystalline silicon is used for the gate electrode of the MISFETs, the MISFETs are advantageously produced by the process which comprises a step of simultaneous oxidation of the surface of the polycrystalline silicon film having a pattern of the gate electrode and; the surface of an insulative film, which is formed on the active region of the MISFETs and which is partly masked by the gate electrode pattern. At least a portion of the. silicon dioxide of the insulative film is converted to silicon nitride at least at a surface portion of the silicon dioxide film. In the simultaneous oxidation step, the oxidation is carried out in such a manner that the silicon oxynitride of the insulative film mentioned above is converted essentially to silicon dioxide. Since the oxidation rate of the polycrystalline silicon is considerably higher, i.e., approximately 8–100 times, than that of the silicon oxynitride, the thickness of the oxidation film on the polycrystalline film is from 5000 to 20000 angstroms and thus considerably greater than the thickness of the silicon oxynitride layer, which is oxidized by the simultaneous oxidation. This fact enables the selective removal of the oxidation film on the silicon substrate and thus, exposure of the substrate. The source and drain regions of MISFETs can be formed on the exposed portions of the substrate. Instead of conventional insulative masks such as a PSG film for covering the gate electrode, the silicon dioxide film which is produced by the oxidation of the insulative film mentioned above is used for the gate elecrode insulator itself. In order to expose the source and drain regions, it was conventionally necessary to use the pattern of these regions and, then, to selectively remove the PSG film for the purpose of only forming windows through such PSG film. On the other hand, by means of the simultaneous oxidation step mentioned above, the windows for the source and drain regions can be simply formed by means of a self-alignment technique with the insulative film covering the gate electrode. In addtiion, becasue of the non-employment of the PSG film, the width of each of the source and drain regions can be reduced to from 1 to 4 microns, for example 2 microns. The conventionally sized source and drain regions had widths of 6 microns. In order to form the source and drain regions, impurity ions may be ion implanted through the oxynitride layer and oxide layer or diffused after removal of these layers. It is possible to dope the impurity ions into the polycrystalline silicon film at the same time as the implantation of ions into the source and drain regions.

The simultaneous oxidation method as explained above can be utilized for the production of RAMs (random access memories) which comprise a capacitor element for storing electric charges or carriers and a gate element of a MOSFET element. In an advantageous process for producing the RAMs, an insulative film, the surface of which is subjected to a nitridation, is formed on a semiconductor silicon substrate to a thickness of from approximately 30 to 5000 angstroms. A polycrystalline silicon film having an electrode pattern of the capacitor element is deposited on the insulative film, and subsequently, both the polycrystalline silicon film and the insulative film are simultaneously oxidized in the manner explained previously. As a result of this oxidation, a silicon dioxide film having a thickness in the range of from approximately 500 to 20000 angstroms is formed on the polycrystalline silicon film for the electrode of the capacitor element. The thickness of the insulative film mentioned above is not increased an appreciable amount by the simultaneous oxidation. After the simultaneous oxidation, a conductive material film, such as a film of aluminum or polycrystalline silicon, is deposited both on the silicon dioxide film and the insulative film which is oxidized due to the simultaneous oxidation. The conductive material film is then selectively removed to form an electrode pattern of the transistor gate. Accordingly, the transistor gate electrode and the memory cell electrode are completely isolated by a thick silicon dioxide film which is formed on the latter electrode.

In the process for producing the RAMs explained hereinabove, it is important that th film of silicon dioxide between the electrodes of the transistor gate and memory cell be considerably thicker than the insulative film of the transistor gate. If the thickness of the silicon dioxide film is as thin as that of the gate insulative film, short circuits between the electrodes of the transistor gate and the memory cell are liable to occur.

Instead of the polycrystalline silicon, a polycrystalline metal silicide, such as platinum silicide or molybdenum silicide, can be used.

The insulative films according to the present invention are also suitable for use as a mask against selective diffusion of impurities into a semiconductor silicon substrate. One of the insulative masks, i.e. the nitridation film of a silicon dioxide film, formed by thermal oxidation of silicon is stable at an elevated temperature of even 1200° C. and has an excellent adhering property with the substrate, because the silicon dioxide is formed by a thermal oxidation of the silicon substrate. Since the surface of such silicon dioxide film is replaced in the diffusion mask by the silicon nitride, having a dense structure, the impurity diffusion through the mask is prevented with a certainty and hence selective diffusion is performed in a desirable manner.

The diffusion mask should have a thickness of from approximately 50 to 10000 angstroms, preferably from 100 to 5000 angstroms. The thermal oxidation film of the silicon substrate to be subjected to the nitridation should have a thickness of from approximately 50 to 10000 angstroms, preferably from 100 to 5000 angstroms. The nitridation time of the silicon dioxide film should be from approximately 1 to 1000 minutes in a plasma and non-plasma atmospheres.

When a direct thermal nitridation, thermal oxidation and nitridation of the silicon substrate are performed successivel, the direct thermal nitridation should be performed in such a manner that the nitride film grows to a thickness of from approximately 20 to 100 angstroms, preferably from 30 to 70 angstroms. The thermal oxidation time should b approximately from 0.1 to 100 hours, preferably from 0.01 to 10 hours. The nitridation after the thermal oxidation step should be carried out from approximately 0.1 to 100 hours, preferably from 0.1 to 10 hours.

By means of the diffusion mask of the present invention, the selective diffusion can be carried out by using a very thin mask, with the result that the mask does not cause any thermal stress on the silicon substrate during the diffusion step. Side diffusion does not occur due to the excellent adherence between the thermal oxidation $SiO_2$ layer of the diffusion mask and the silicon substrate. Accordingly, it is possible to produce fine diffused areas on the silicon substrate. Furthermore, although the conventional, silicon dioxide mask cannot mask the silicon substrate against the impurity boron under a hydrogen atmosphere, no such problem as the boron diffusion through the mask occurs during the diffusion and heat treatment steps when the diffusion mask of the present invention. Deterioration of the $SiO_2$ layer and of the interface between the $SiO_2$ layer and the silicon substrate are advantageously prevented by the diffusion mask of the present invention.

The insulative films according to the present invention are furthermore suitable for use as the dielectric material of a capacitor of the semiconductor devices. An electrode is deposited on each of these insulative films.

The insulative material film for the capacitor should have a thickness of from approximately 30 to 10000 angstroms, preferably 50 to 5000 angstroms. The thermal oxidation film of the silicon substrate to be subjected to the nitridation should have a thickness of from approximately 30 to 5000 angstroms, preferably from 50 to 3000 angstroms. The nitridation time of the silicon dioxide film should approximately 1 to 1000 minutes in the plasma and non-plasma atmospheres.

When a dense, insulative material film in the range of from approximately 30 to 180 angstroms is desired, the direct thermal nitridation, thermal oxidation and nitridation of the silicon substrate should be performed successively. The direct thermal nitridation should be preformed in such a manner that the nitride film grows to a thickness of from approximately 20 to 100 angstroms, preferably from 30 to 70 angstroms. The thermal oxidation time should be approximately from 0.1 to 100 hours, preferably from 0.1 to 10 hours. The nitridation after the thermal oxidation step should be carried out from approximately 0.1 to 100 hours, preferably from 0.1 to 10 hours.

The insulative material of the capacitor according to the present invention exhibits higher dielectric constant than the dielectric constant of silicon dioxide. The relative dielectric constant of the insulative material according to the present invention is generally from 4 to 6. Since the insulative material can be made thin, it is possible to manufacture a capacitor having a high capacitance value from such insulative material. This capacitance value is approximately 30% higher than that of the conventional capacitor using a silicon dioxide as the dielectric material.

A semiconductor memory cell according to the present invention is characterized by including the excellent capacitor element mentioned above on the semiconductor silicon substrate. Consequently, the amount of electric charges stored in a memory cell of the semiconductor device of the present invention is 30% higher than that in the case of using the conventional capacitor mentioned above. Accordingly, it is possible to read out the memory cell with a very low error rate.

It is possible by the use of the capacitor according to the present invention to reduce the thickness of the insulative material to a value of from 30 to 100 angstroms. Since a large number of the electric charges can be stored in the memory cell using the thin insulative film for a capacitor element of the memory cell, the area of the memory cell can be reduced to less than that of the conventional memory cells.

The processes for producing the capacitor element of the present invention are essentially the same as that for the MIS structure. However, a metal film deposited on the insulative materials should be shaped to an effective electrode pattern of a small area ranging from 100 mm$^2$ to $1 \times 10^{-6}$ mm$^2$, so that a compact capacitor can be produced.

When instead of manufacturing the capacitor element as an integral portion of the silicon substrate, the capacitor element is to be formed as a separate element, the silicon substrate is cut along the metal electrode.

EXAMPLE 1

P-type silicon substrates having a resistivity of between 4 and 5 $\Omega$.cm were heated to 1000° C., for a period of 6 minutes, under an atmosphere of argon, which was bubbled through water having a temperature of 40° C. As a result of the heating, a silicon dioxide film having a thickness of approximately 90 angstroms was formed on the silicon substrates. These silicon substrates were then heated to 1200° C., for different periods of time, in a nitridation atmosphere of ammonia with a flow rate of 5000 cc/minute. The heating time was 5 hours at the maximum.

AFter the heating for 5 hours, the thickness of the insulative film was increased by approximately 10 angstroms. This film was subjected to an Auger analysis, wherein the oxygen and nitrogen components of the insulative film were ejected from the film by using the insulative film as a target of sputtering. The surface portion of the insultative film was gradually removed by the sputtering. The result of Auger analysis was as shown in FIG. 1, in which the ordinate designates the Auger peak in an arbitrary unit and the abscissa designates the sputtering time. The Auguer peak value of the curve for nitrogan denoted as "1" in FIG. 1 is approximately the same as that of oxygen denoted as "2" before bombardment. This fact means that the molar ratio of oxygen and nitrogen is approximately units at the surrface of the insulative film. The curve 1 gradually decreases due to the known knock-on effect of the sputtering. The actual content of nitrogen atoms decreases in the interior from approximately 30 angstroms at the surface of the insulative film. In other words only the surface of the silicon dioxide is converted to silicon oxynitride.

The index of refraction of the insulative film on the silicon substrates was measured. The maximum index of refraction was approximately 1.65 with regard to the insulative film formed after 5 hours of heating.

EXAMPLE 2

The process of Example 1 was repeated, except that the thermal oxidation film grew to a thickness of 500 angstroms, and further, the nitridation was carried out at 1200° for a period of 60 minutes.

Figure 2:
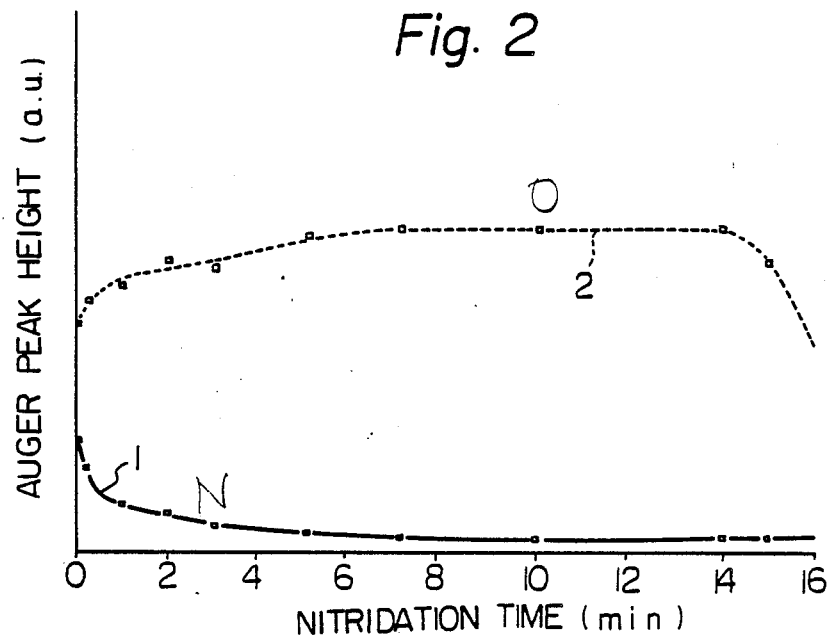

The results of Auger analysis was as shown in FIG. 2. It will be apparent from FIG. 2 that the molar ratio of oxygen to nitrogen was approximately 2:1 at the surface of the insulative film.

EXAMPLE 3

P-type silicon substrates having a resistivity between 4 and 5 ohm-cm were heated to 1000° C., for a period of 35 minutes, under an atmosphere of argon, which was bubbled through water having a temperature of 50° C. As a result of the heating, a silicon dioxide film having a thickness of approximately 500 angstroms was formed on the silicon substrates. Each of the substrates was then placed in a plasma-generating apparatus, into which nitrogen gas was introduced. The pressure of the chamber was reduced to $10^{-1}$ Torr and the nitrogen gas was activated to plasma by an electric charge of 6 KV with a frequency of 400 KHz. The substrates exposed to the plasma gas of nitrogen were heated to 1030° C., for a period of 5 hours at the maximum, by means of the RF power of 6 KV.

The results of the Auger analysis was as shown in FIG. 3. It will be apparent from FIG. 3, that the surface of the silicon oxide film was converted to the silicon oxynitride having a molar ratio of O/N of approximately 2.5.

The index of refraction of the insulative film on the silicon substrates was measured. The maximum index of refraction was approximately 1.65 with regard to the insulative film formed after approximately 5 hours of heating.

The thickness of the insulative film was increased by approximately 20 angstroms after the plasma nitridation for 5 hours.

Instead of the nitrogen gas, ammonia, a gaseous mixture of nitrogen and hydrogen, a gaseous mixture of nitrogen and hydrochloride, and a gaseous mixture of nitrogen and chlorine, were used separately for the source of the plasma gas. Essentially same results as explained above were obtained with these gases.

EXAMPLE 4

The process of Example 1 was repeated except that an aluminum electrode was vacuum-evaporated on the insulative film to a thickness of 4000 angstroms.

Figure 4:
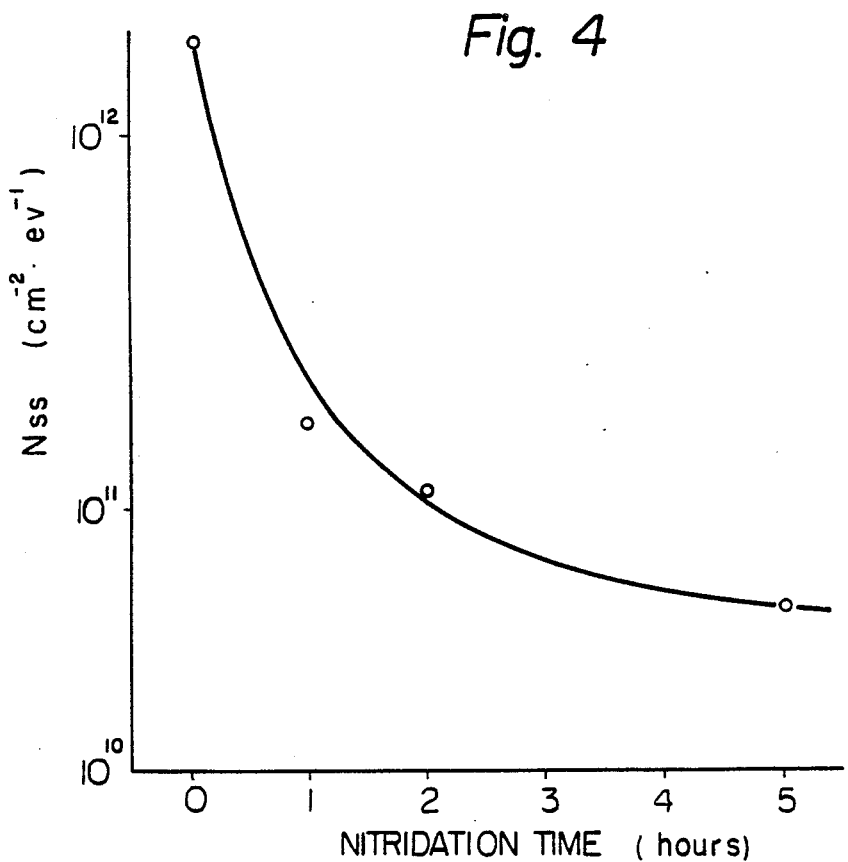
FIG. 4 is a graph of the surface state density ($N_{ss}$), which varies with the heat treatment time.

The measurement result of the surface state density $N_{ss}$ is shown in FIG. 4, wherein the ordinate and abscissa designate $N_{ss}$ ($cm^{-2}.ev^{-1}$) and heating time (hours), respectively. The $N_{ss}$ values in FIG. 4 were measured under the condition that the electrostatic potential ($\phi s$) at the interface between the substrate and the insulation film was set at 0.3 eV. It will be apparent from FIG. 4 that the $N_{ss}$ is reduced with an increase in the heating time.

EXAMPLE 5

The process of Example 2 was repeated, except that, the silicon substrates were heated in the nitirdation atmosphere for 2 hours in a temperature ranging from 900 to 1200° C. and further, an aluminum electrode was vacuum-evaporated on the insulative film to a thickness of 4000 angstroms.

Figure 5:
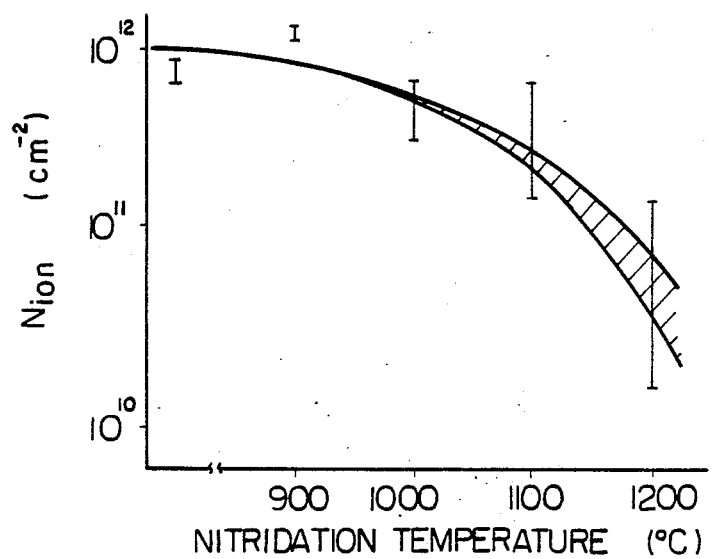
FIG. 5 is a graph of ion surface density versus treatment temperature.

The measurement result of the contamination ion density ($N_{ion}$) is shown in FIG. 5, wherein the ordinate and abscissa designate $N_{ion}$ ($cm^{-2}$) and heat temperature, respectively. It will be apparent from FIG. 5 that the $N_{ion}$ is reduced with an increase in the nitridation temperature.

EXAMPLE 6

Figure 6:
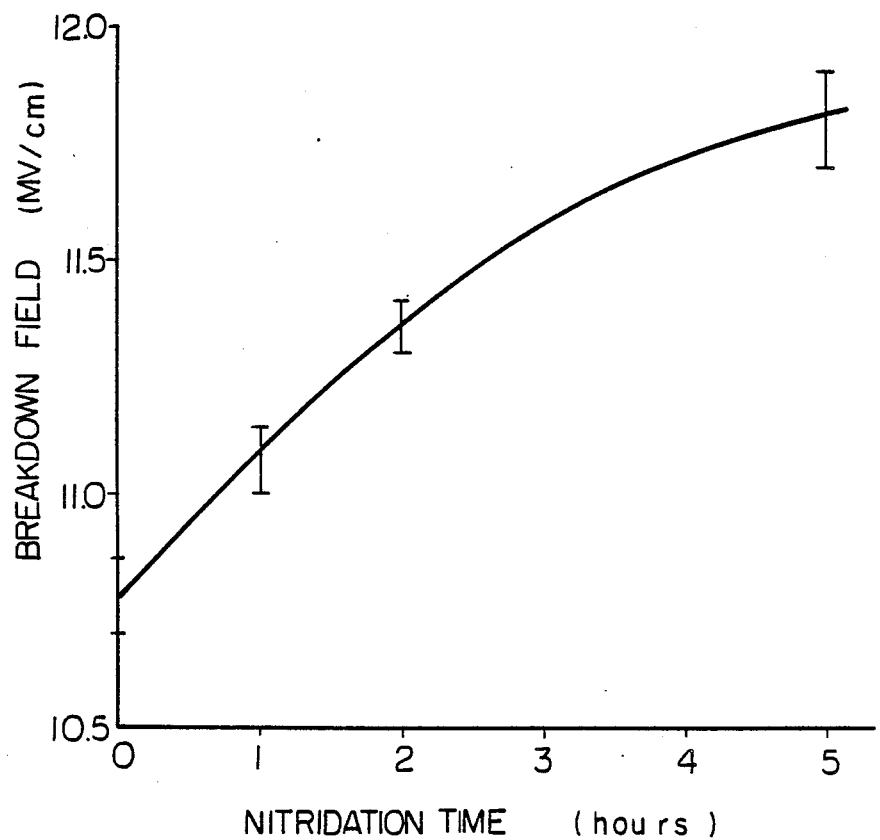
FIG. 6 is a graph of the breakdown voltage of the insulating film, which voltage varies with the heating time in the nitridation atmosphere.

The process of Example 1 was repeated, except that the thickness of the oxide films was 700 angstroms. The breakdown voltages of the produced films were measured. As is apparent from FIG. 6, in which the breakdown voltage per thickness of the insulative film (breakdown field) is shown in the ordinate, and the heating time in the nitridation atmosphere is shown in the abscissa, the breakdown voltage is increased as the increase in the heating time.

EXAMPLE 7

An MISFET was produced in the present Example as explained with reference to FIGS. 7 through 12.

Figure 7:
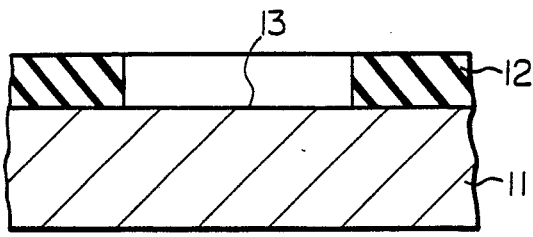

Referring to FIG. 7, a silicon dioxide film 12 was formed by thermal oxidation of a P-type silicon substrate 11, having a resistivity of 1 $\Omega$.cm and including a boron dopant. A window was formed through the silicon dioxide film 12, so as to leave this film as a field insulation film. The window exposed an active region 13 of the substrate 11.

Figure 8:
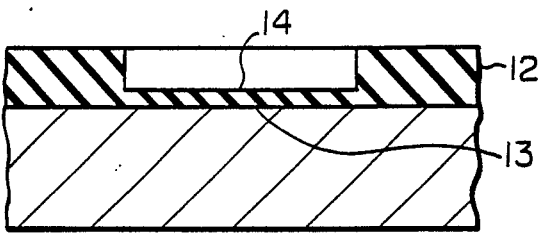
Figure 9:
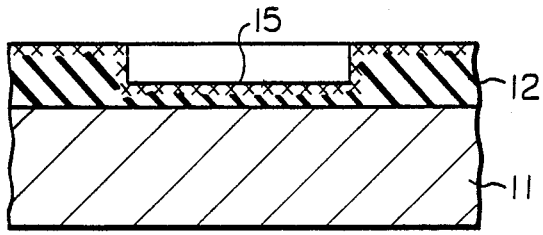

Referring to FIG. 8, the active region 13 of the srlicon substrate exposed through the window was subjected to a
thermal oxidation similar to that explained in Example 1, and a silicon dioxide film 14, for the gate insulation film, having a thickness of 500 angstroms was formed. Nitridation of the silicon oxide films 12 and 14 was performed under the conditions of heating the substrate 11, under an $NH_3$ atmosphere, at 1100° C. for 30 minutes. The surface of the oxide films 12 and 14, for the field and gate insulations, respectively, which was converted to silicon oxynitride, is schematically shown in FIG. 9 by number 15 and "X" marks.

Figure 10:
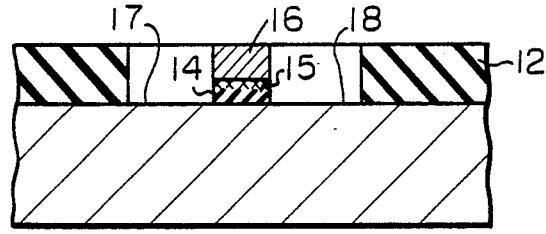

Referring to FIG. 10, a polycrystalline silicon film 16 was deposited by a CVD process on the silicon oxynitride 15 to a thickness of 3000 angstroms, and then, selectively removed to produce an electrode pattern of a gate of the MISFET. The insulative film (the original oxide film 14 and the silicon oxynitride film 15) was, therefore, partly exposed, and then, the exposed insulative film was removed by an etching solution of a buffered hydrofluoric acid. During the etching, the polycrystalline silicon film 16 masked the underlying insulative film. The etching was terminated when the silicon substrate 11 was exposed. Windows 17 and 18 for the diffusion of the source and drain of the MISFET were formed by the etching.

Figure 11:
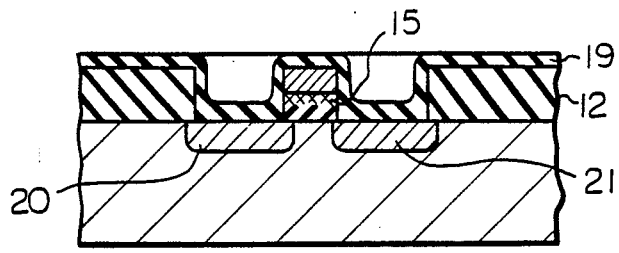

Referring to FIG. 11, a phospho-silicate glass (PSG) film 19, containing 5% of phosphorus, was deposited by a CVD process to a thickness of approximately 3000 angstroms. Subsequently, the PSG film 19 was heated to 1000° C., for 30 minutes, in a nitrogen atmosphere, thereby diffusing the phosphorus from the PSG film 19 into the substrate 11. An $n^+$type source region 20 and drain region 21 were, therefore, formed on the diffused surface of the substrate 11.

Figure 12:
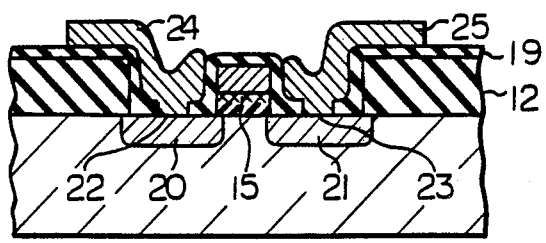

Referring to FIG. 12, the PSG film 19 was selectively removed to expose the source and drain regions 20 and 21, respectively, so that contact windows 22 and 23 of the electrodes were formed. Aluminum was deposited on the substrate and selectively removed to form the pattern of a source electrode 24 and a pattern of the drain electrode 25.

EXAMPLE 8

An MISFET was produced by a similar process to that described in Example 7, using a plasma nitridation atmosphere. The process for producing the MISFET was the same as that described in Example 6, except for the nitridation method of the silicon dioxide film 12

(FIG. 9). The nitridation method was carried out for a period of approximately 60 minutes under the plasma nitridation condition explained in Example 3.

EXAMPLE 9

Figure 13:
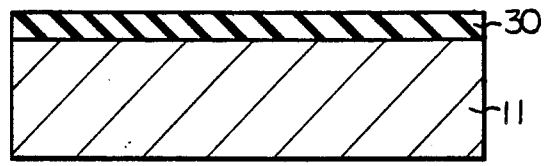
FIGS. 13 through 16 are schematic, cross-sectional views of a semiconductor silicon substrate, on which insulating layers are successively formed.

The present Example describes another method for forming a gate insulation film of a MISFET. Referring to FIG. 13, a thin layer 30 of silicon nitride was formed on a P-type semiconductor silicon substrate 11 having a resistivity of 10Ω.cm, by heating the substrate 11 at 1100° C., for 30 minutes, in an $NH_3$ atmosphere. The thin layer 30 had a thickness of approximately 40 angstroms and was essentially composed of the silicon nitride.

Figure 14:
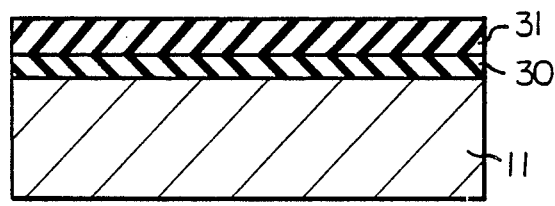

Referring to FIG. 14, the thin nitride layer 30 was partly converted to an oxidized layer 31 by heating the thin nitride layer 30 to 1100° C., for 30 minutes, in an oxygen atmosphere, the oxygen of which was bubbled through water at 80° C. Due to the heating in the oxygen atmosphere, the surface of the thin nitride layer 30 was oxidized to the layer 31, with the result that the thickness of the nitride layer 30 was reduced to 10 angstroms. Since the thickness of the oxidized layer 31 was 60 angstroms, the total thickness of the insulative layers 30 and 31 was 70 angstroms.

Figure 15:
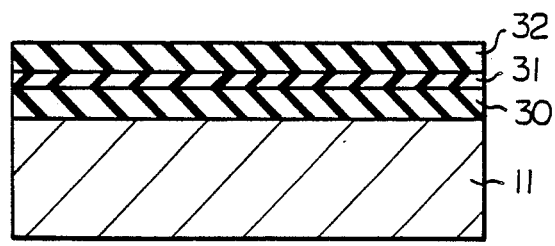

Referring to FIG. 15, the oxidized layer 31 was partly converted to a nitrogen-diffused layer 32 by again heating the substrate 11 to 1100° C., for a period of 1 hour, in an $NH_3$ atmosphere. Since nitrogen atoms were diffused from the atmosphere into the substrate 11 through the oxidized layer 31, the nitrogen content in the substrate 11 and the oxidized layer was gradually increased. The thickness of the layer 30 was, therefore, increased.

EXAMPLE 10

Figure 16:
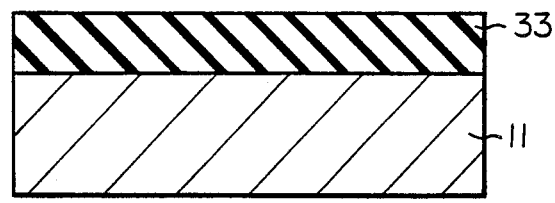

The process of Example 9 was further continued, so that the nitridation time related to FIG. 15 amounted to 5 hours. As seen in FIGS. 15 and 16, the layers 30, 31 and 32 on the substrate 11 were completely subjected to the nitridation, and a nitrided film 33 having a thickness of 70 angstroms was formed.

EXAMPLE 11

Figure 17:
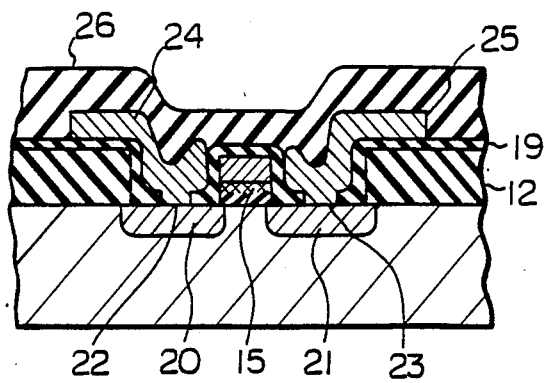
FIG. 17 is a cross-sectional view of a MISFET.

On the MISFET produced in Example 7, a silicon dioxide film 26 (FIG. 17) was formed by a CVD process to a thickness of 500 angstroms. The MISFET was then heated in a plasma atmosphere at 850° C., for 30 minutes. The plasma atmosphere was generated by applying an electrical discharge to a gaseous mixture of nitrogen and hydrogen in a volume ratio of 10:1. The electrical discharge was induced by applying a high frequency current of 400 KHz and 4 KV to the gaseous mixture under a pressure of 0.1 Torr. As a result of the heating under the plasma atmosphere, a silicon oxynitride layer was formed on the surface of the film 26 at a thickness of approximately 30 angstroms.

EXAMPLE 12 (control)

A silicon dioxide film completely free from pin holes was formed on P-type silicon substrates having a resistivity of 1Ω.cm to a thickness of 100 angstroms. An aluminum electrode was deposited on the silicon dioxide film. One of the substrates with the silicon dioxide and aluminum electrode was heated at 450° C., in an nitrogen ($N_2$) gas, for 30 minutes. The insulative properties of the silicon oxide film were found to have deteriorated due to the heat treatment.

A molybdenum electrode was then deposited on the silicon dioxide film of the other substrate, and a heat treatment was carried out at a temperature of 1000° C. As a result of the heat treatment molybdenum atoms were diffused into the silicon dioxide film, and a molybdenum electrode was partly oxidized by the silicon dioxide film. The deterioration of the insulative properties was more serious than in the case of the aluminum electrode.

EXAMPLE 13

Figure 18:
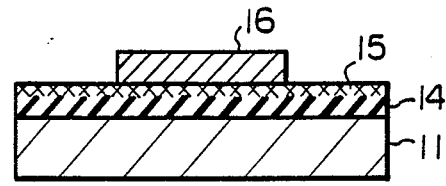
FIG. 18 is a cross-sectional view of a MIS structure.

Referring to FIG. 18, a silicon dioxide film 14 having a thickness of 100 angstroms was formed on silicon substrates 11 by heating the substrate to 950° C. for a period of 10 minutes in a dry oxygen atmosphere. The so treated substrates 11 were heated to 1200° C. for a period of 1 hour in a nitridation atmosphere consisting of 100% of ammonia. As a result of the nitridation the surface of the film 12 was changed to silicon oxynitride layer 15 to a depth of approximately 30 angstroms from the surface of film 14. An aluminum film 16 was deposited on the film 14 to a thickness of approximately 1 micron by a vacuum deposition and then selectively removed to form an electrode pattern having a diameter of 1 mm. The so formed MIS structures as seen in FIG. 18 were heated to 450° C. for 30 minutes, while one of the MIS structures was heated in a nitrogen atmosphere and the other was heated in an atmosphere of gaseous mixture of ammonia and hydrogen.

A measurement of leak current was performed by applying an electric potential of 3MV/cm to the MIS structures. Since no leak current was observed in the measurement, the film 12 was not deteriorated by the heat treatment.

EXAMPLE 14 (control)

The process and measurement in Example 13 was repeated except for the nitridation of the silicon dioxide film 12. Leak current of 0.1 mA was observed.

EXAMPLE 15

The process of Example 13 was repeated. However, instead of the aluminum, gold to be used for the conductor wiring was used. After the heat treatment at approximately 450° C., neither resistance increase nor deterioration of the gold film 16 (FIG. 18) occurred.

EXAMPLE 16

Figure 19:
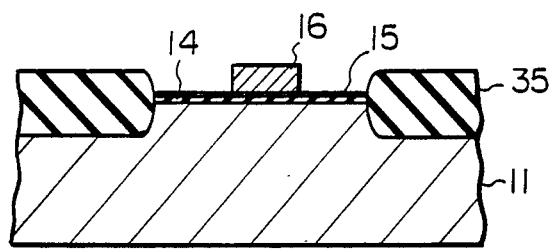
FIGS. 19 through 21 are cross-sectional views of a semiconductor silicon substrate and of various elements of another MISFET which are successively formed thereon.

Referring to FIG. 19, a silicon dioxide film 35 for the field insulation was selectively formed on the P-type silicon substrate 11 to a thickness of approximately 8000 angstroms. On the exposed portion of the substrate 11 within the silicon dioxide film 35, a silicon dioxide film 14 having a thickness of 400 angstroms was formed by subjecting said exposed portion to an oxidation at 1000° C. for 30 minutes in a dry oxygen atmosphere. The silicon dioxide film 14 was then subjected to a nitridation at 1100° C. for a period of 1 hour in a purified ammonium atmosphere, and a silicon oxynitride layer 15 was formed to a thickness of approximately 30 angstroms. The total thickness of the layer 15 and the film 14, which was still composed of silicon dioxide, increased only 5% of the thickness of the original, silicon dioxide film 14. The polycrystalline silicon film 16 was then deposited on the silicon oxynitride layer 15 to a thickness of 4000 angstroms. Simultaneously with the deposition, the polycrystalline silicon film 16 was doped by impurities of phosphorus.

Figure 20:
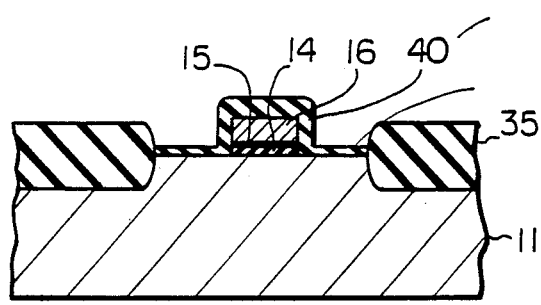

Referring to FIG. 20, the top surface of the semiconductor structure as seen in FIG. 19 was oxidized at 1150° C. for 90 minutes in a dry oxygen atmosphere. Due to the oxidation, the polycrystalline silicon film 16 as well as the silicon oxynitride layer 15 were oxidized. The film formed by this oxidation is denoted as 40 in FIG. 20. Since the oxidation rate of the polycrystalline silicon is considerably higher than that of the silicon oxynitride, the thickness of the oxidation film 40 was not uniform, but the thickness of the film 40 on the polycrystalline silicon film 16 was 3000 angstroms and that on the substrate 11 was 420 angstroms. The oxidation film 40 on the silicon substrate did not consist only of the silicon dioxide but contained a trace amount of silicon nitride. However, the oxidation film formed both on the substrate 11 and the polycrystalline silicon film 16 consisted essentially of silicon dioxide.

Figure 21:
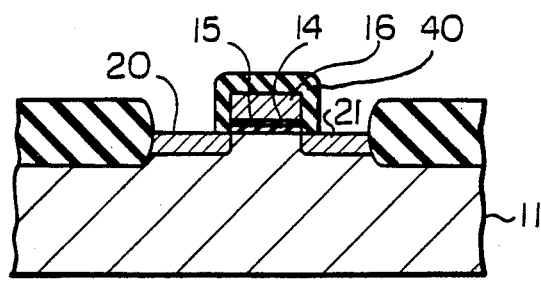

Referring to FIG. 21, the oxidation film 40 was selectively removed by an etching solution containing hydrofluoric acid, so as to expose the silicon substrate 11. During the etching, the oxidation film 40 formed on the polycrystalline silicon film 16 was also removed in an amount corresponding to the thickness of the oxidation film 40 formed on the substrate 11. In other words, the thickness of the oxidation film 40 remaining as seen in FIG. 21 had a thickness of approximately 2500 angstroms. Subsequently, the source region 20 and drain region 21 were formed by the diffusion of phosphorus. Aluminum electrodes (not shown) for the source and drain regions 20 and 21, respectively were formed by the conventional vacuum evaporation.

EXAMPLE 17

A silicon dioxide film was formed on a silicon substrate to a thickness of approximately 390 angstroms and, then, subjected to a nitridation at 1200° C., for a period of 1 hour, in an ammonia atmosphere. As a result of the nitridation, 30 angstroms of the silicon dioxide film was converted to a silicon oxynitride.

Figure 22:
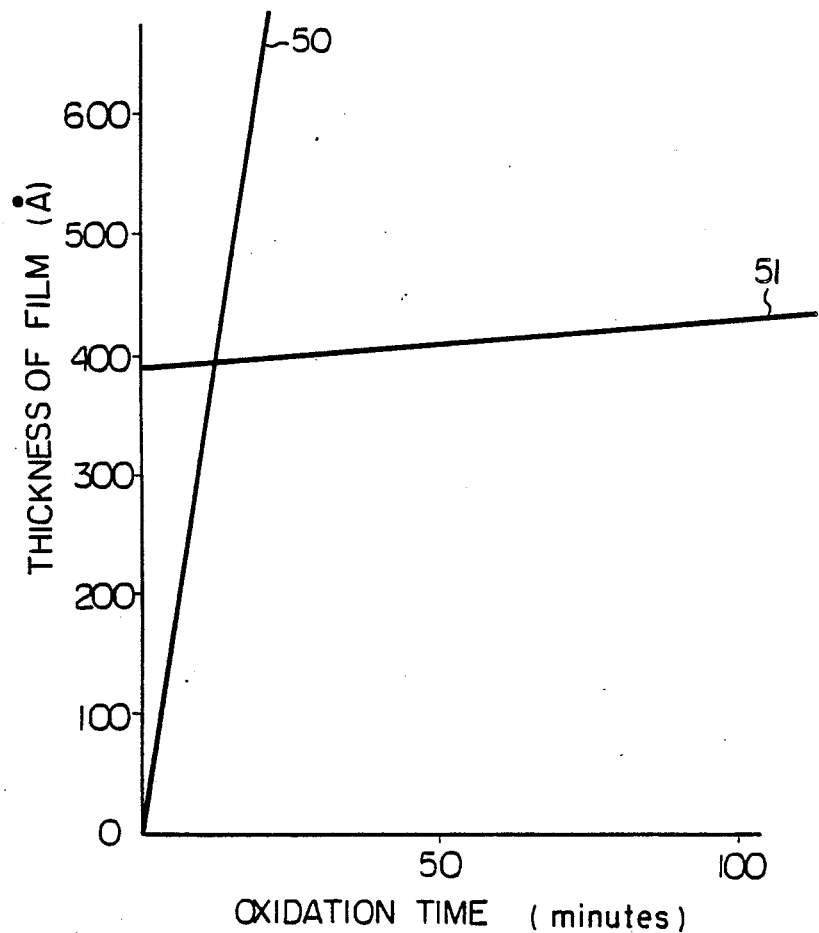
FIG. 22 is a graph indicating the thickness increase of insulating films.

The silicon dioxide film as treated above and a separate piece of polycrystalline silicon were oxidized at 1150° C., for 90 minutes, in dry oxygen. FIG. 22 illustrates a thickness 50 of oxide film formed on the polycrystalline silicon and a thickness 51 of a growing film on the silicon substrate mentioned above. The thickness 50 amounted to approximately 3000 angstroms after the oxidation for a period of 90 minutes, while the thickness 51 exhibited only approximately 30 angstroms of increase after the oxidation for a period of 90 minutes.

EXAMPLE 18

Figure 23:
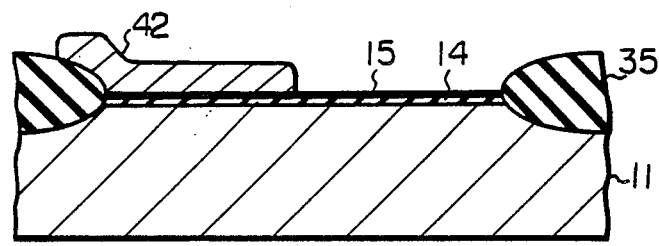
FIGS. 23 through 25 are cross-sectional views of a semiconductor silicon substrate and various elements of a RAM formed thereon.

Referring to FIG. 23, in which the same elements of the MISFET as in FIG. 19 are denoted with the same reference numerals, a doped, polycrystalline silicon film 42 was deposited on the insulative films 14 and 15 and, then, selectively removed.

Figure 24:
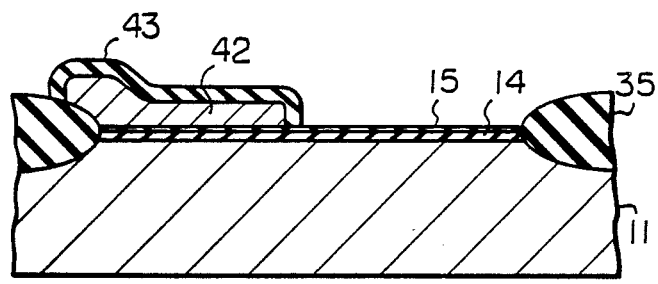

Referring to FIG. 24, a silicon dioxide film 43 having a thickness of approximately 2000 angstroms was formed on the polycrystalline silicon film 42 by heating the elements illustrated in FIG. 23 at 1150° C., for 60 minutes, in dry oxygen. The exposed silicon oxynitride layer 15 was not completely oxidized by the heat treatment, and a part of the silicon oxynitride remained on the surface of the silicon substrate 11. The elements 42, 43, and the portion of the insulative films 14, 15 and the silicon substrate 11 under these elements 42, 43 constitute a carrier storing element of a RAM (random access memory).

Figure 25:
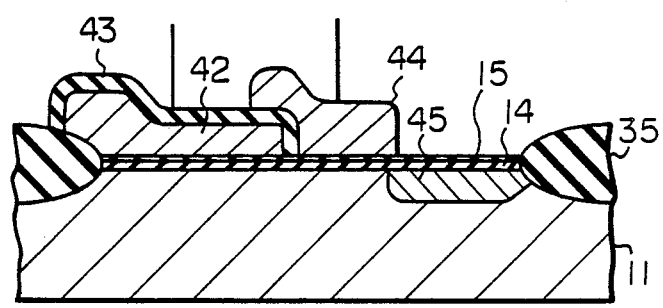

Referring to FIG. 25, a polycrystalline silicon film 44 for the gate electrode of a transistor was deposited on the silicon dioxide film 43 and the silicon oxynitride layer 15. The silicon oxynitride layer 15 was oxidized by the oxidation explained in connection with FIG. 24 but still contained silicon nitride. The polycrystalline silicon film 44 was shaped into a pattern of a gate electrode. Subsequently, arsenic ions (As+) were ion implated at an energy of 150 KeV and a dosing amount of $2 \times 10^{15}/cm^2$, so as to dope impurities into the polycrystalline silicon film 44 and the input-output region 45 of the transistor mentioned above. After the ion implantation, heat treatment was performed at 900° C. for 30 minutes, so as to activate ion implanted impurites.

EXAMPLE 19

Figure 26:
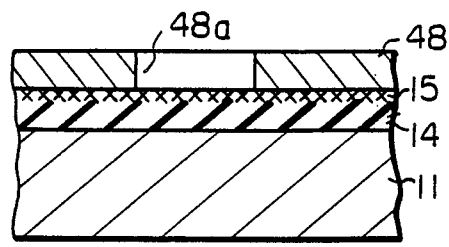
FIGS. 26 and 27 are cross-sectional views of a semiconductor substrate and films formed thereon for the selective diffusion of impurities.

A silicon dioxide film 14 (FIG. 26) was formed on a (100) silicon substrate 11 containing $5 \times 10^{15}/cm^2$ in terms of acceptor concentration. The heat treatment for forming the silicon dioxide film 14 was performed at 950° C., for 10 minutes, in a dry oxygen atmosphere. The thickness of the silicon dioxide film 14 was approximately 100 angstroms. A surface portion of the silicon dioxide film 14 was converted to a layer (silicon oxynitride layer) 15, in which silicon oxide and nitride were mixed, by a heat treatment, for 1 hour, in a nitridation atmosphere containing 100% ammonia. The silicon oxynitride layer 14 had a thickness of approximately 30 angstroms. A photo resist film 48 was deposited on the silicon oxynitride layer 15 and exposed to a light through a mask, so as to form a window 48a. The layer 15 and film 14, which was exposed within the window 48a, were removed by an etching solution containing hydrofluoric acid.

Figure 27:
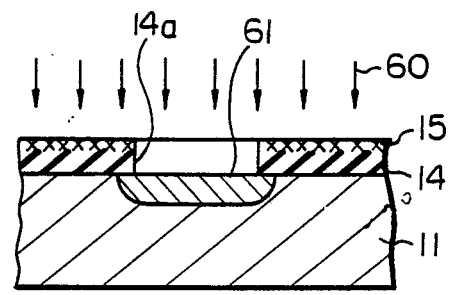

Referring to FIG. 27, the window 14 exposed the surface portion of the silicon substrate to form a diffused region 61. Impurities were selectively diffused by using the silicon oxynitride layer 15 and the silicon dioxide film 14 as a diffusion mask. Phosphine gas 60 contained in a nitrogen atmosphere in an amount of 3% was brought into contact with the substrate 11, at 1000° C., for 30 minutes. An N+type diffused layer 61, having a thickness of approximately 6000 angstroms, was formed by the diffusion. Impurities were diffused below the mask consisting of the silicon oxynitride layer 15 and the silicon dioxide film 14.

EXAMPLE 20

A capacitor structure as seen in FIG. 18 was produced under the f conditions.

(1) Silicon substrate 11: N type silicon having a resistivity of 0.1Ω.cm.

(2) Silicon dioxide film 14: thermal oxidation film having a thickness of approximately 100 angstroms and formed by heat treatment at 1000° C., for 5 minutes, in a dry oxygen.

(3) Silicon oxynitride layer 15: thermal nitridation layer having a thickness of approximately 30 angstoms, and formed by a nitridation heat treatment at 1200° C., for 1 hour, in a nitridation atmosphere of 100% NH$_3$.

(4) Electrode 16: aluminum electrode having a surface area of 1 mm$^2$.

The capacitor structure mentioned above was heated at 400° C. in a nitrogen atmosphere in the final production step of the capacitor. The capacitance and dielectric loss (tan δ at 1 MHz) were 3500 pF and $10^{-3}$, respectively.

EXAMPLE 21

Figure 28:
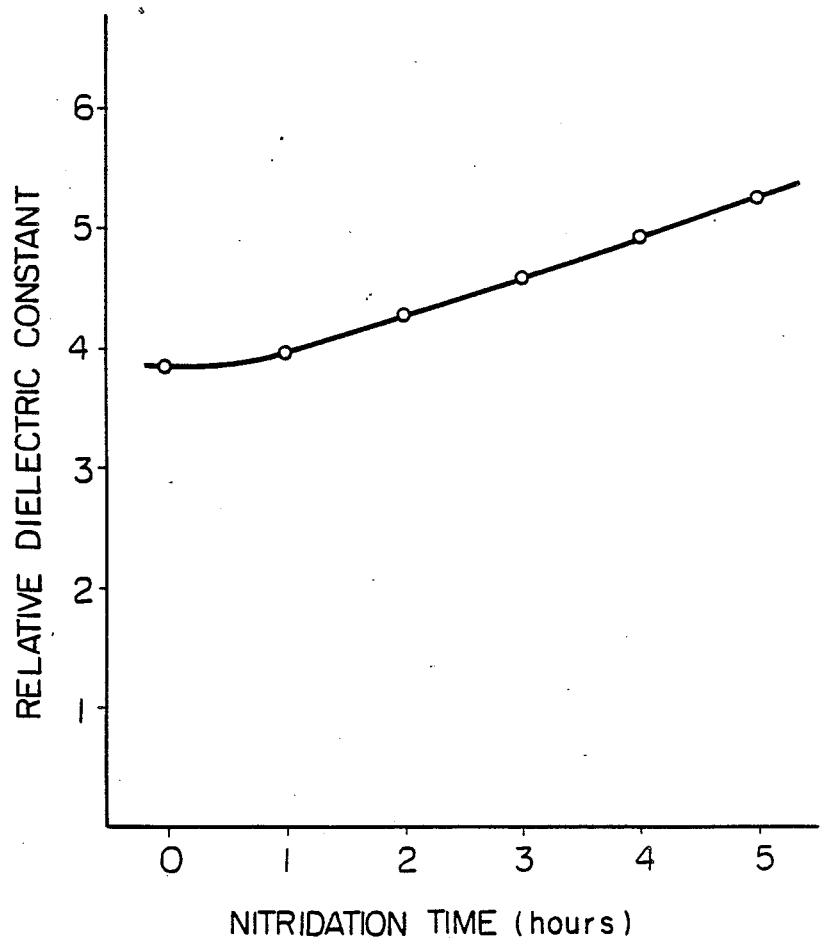
FIG. 28 is a graph of relative dielectric constant, which varies with the heat treatment time.

The same capacitor as in Example 19 was produced by varing the nitridation time and the specific dielectric constant thereof was measured under the application of a high frequency voltage at 1 MHz to the capacitor. The measurement results are as seen in FIG. 28. The relative dielectric constant of the capacitor at zero hour of heat treatment time was 3.85, while the specific dielectric constant increased to 5.30 after the heat treatment was carried out for 5 hours. The leak current did not increase after the heat treatment for 5 hours. Accordingly the increase of the relative dielectric constant, which amounts to 38%, means a decrease of dielectric loss (tan δ) in an amount of 38%.

EXAMPLE 22

Figure 29:
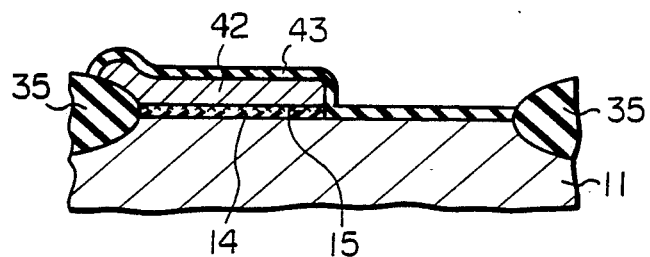
FIGS. 29 and 30 are cross-sectional views of a semiconductor silicon substrate and various elements of a dynamic memory element formed thereon.
Figure 30:
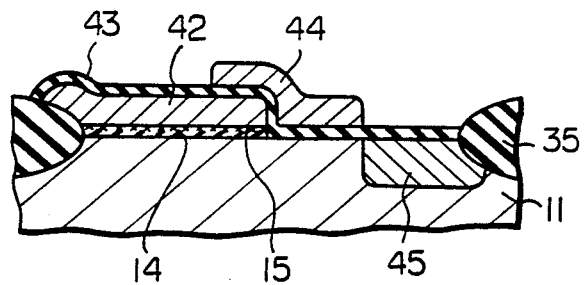

A dynamic memory device was produced by a process corresponding to FIGS. 23, 29 and 30.

A field insulation film 35 having a thickness of 8000 angstroms was formed by a selective oxidation on the P type silicon substrate having a resistivity of 5Ω.cm. A 30 Å thick silicon oxynitride layer 15 was formed on the thermal oxidation film 14 of silicon having a thickness of 200 angstroms. The nitridation treatment for forming the silicon oxynitride layer was carried out at 1100° C., for 1 hour, in an ammonia atmosphere. A 3000 Å thick electrode 42 for the carrier storing region of the substrate 11 was produced from a polycrystalline silicon.

Referring to FIG. 29, the silicon dioxide film 14 and the silicon oxynitride layer 15 were selectively removed using the polycrystalline silicon electrode 42 as a mask and a solution of buffered hydrofluoric acid as an etching agent. Subsequently, a heat treatment was performed at 1100° C., for 30 minutes, in a dry oxygen atmosphere, thereby forming the silicon dioxide film 43, which had a thickness of approximately 700 angstroms.

Referring to FIG. 30, a 3000 Å thick polycrystalline silicon film 44 was deposited and then selectively removed, so as to provide the film 44 with a pattern of the gate of a transistor for transferring carriers to and from the memory cell mentioned above. Subsequently, phosphorus T ions (P+) were injected into the polycrystalline silicon film 44 and the region (N+type region) 45 of the substrate 11, at an ion energy of 150 KeV and a dosing amount of $2 \times 10^{15}/cm^2$.

What we claim is:

1. A process for producing a semiconductor device including an insulative film comprising the steps of:
    forming a silicon dioxide film on a semiconductor silicon substrate by thermal oxidation of a top portion of said substrate;
    heating said silicon dioxide film in a plasma nitridation atmosphere comprising at least one gas selected from the group consisting of ammonia and hydrazine to a temperature in the range of 800° C. to 1300° C.; and
    replacing oxygen atoms of said silicon dioxide film with nitrogen of said nitridation atmosphere, while said nitrogen diffuses through said silicon dioxide film so as to convert at least a surface portion of said silicon dioxide film to at least silicon oxynitride, and so that a distribution of nitrogen in the film decreases with the depth from the top portion toward the inside of the film.

2. A process according to claim 1, wherein by said thermal oxidation, a silicon dioxide film having a thickness in the range from 30 to 20000 angstroms is formed.

3. A process according to claim 1, wherein said nitridation atmosphere comprises at least one gas selected from the group consisting of ammonia, hydrazine and nitrogen.

4. A process for producing a semiconductor device including at least one MISFET comprsiing the steps of:
    forming a silicon dioxide film on a semiconductor silicon substrate by thermal oxidation thereof;
    heating said silicon dioxide film in a plasma nitridation atmosphere to a temperature in the range of 800° C. to 1300° C.;
    replacing oxygen atoms of said silicon dioxide film with nitrogen of said nitridation atmosphere, while said nitrogen diffuses through said silicon dioxide film so as to form an insulative film by converting at least a surface portion of said silicon dioxide to at least silicon oxynitride at least at a surface portion of said silicon dioxide film and so that a distribution of nitrogen in the film decreases with the depth from the top portion toward the inside of the film;
    depositing a first film comprising one of a polycrystalline a silicon and metal silicide film on said insulative film;
    selectively removing said first film, thereby providing the remaining first film with a pattern of a gate electrode of said at least one MISFET element and exposing a portion of said insulative film;
    heating said semiconductor silicon substrate to form a silicon dioxide film on said first film and essentially converting said silicon oxynitride to silicon dioxide, said ioxide of said first film comprising a thickness substantially greater than said oxidized insulative film; and
    removing said exposed insulative film, to selectively expose said semiconductor isilicon substrate, while the silicon dioxide film on said first film is removed by an amount corresponding to the thickness of said exposed insulative film being removed.

5. A method of forming an insulative film for multiple purposes in the field of semiconductor devices, said method comprising:
    providing a substrate of single crystal silicon;
    heating said substrate in an oxidizing atmosphere to oxidize a surface layer of said substrate;
    heating said substrate in a plasma nitridation atmosphere to a temperature in the range of 800° C. to 1300° C.;
    replacing oxygen atoms of the silicon dioxide film with nitrogen of said nitridation atmosphere, while said nitrogen diffuses through the silicon dioxide film so as to at least partialy nitridate at least a surface portion of said oxide, and so that a distribution of nitrogen in the film decreases with the depth from the top portion toward the inside of the film.

6. A process for producing a semiconductor device including an insulative film comprising the steps of:
    forming a silicon dioxide film on the semiconductor device by thermal oxidation;
    heating said silicon dioxide film in a plasma nitridation atmosphere to a temperature in the range of 800° C. to 1300° C.; and
    replacing oxygen atom of said silicon dioxide film with nitrogen of said nitridation atmosphere, while said nitrogen diffuses through said silicon dioxide film so as to convert at least a surface portion of said silicon dioxide film to at least silicon oxynitride, and so that a distribution of nitrogen in the film decreases with the depth from the top portion toward the inside of the film.

* * * * *

UNITED STATES PATENT AND TRADEMARK OFFICE
CERTIFICATE OF CORRECTION

PATENT NO. : 4,980,307
DATED : December 25, 1990
INVENTOR(S) : Takashi Ito et al.

It is certified that error appears in the above-identified patent and that said Letters Patent is hereby corrected as shown below:

Title Page, [60] Related U.S. Application Data:

line 2, "195,385," should be --195,386, abandoned--.

Title Page, [30] Foreign Application Priority Data:

"June 14, 1979 [JP] Japan ... 54-71618" should be --June 14, 1978 [JP] Japan...53-71618--;

"June 15, 1979 [JP] Japan...54-72654" should be --June 15, 1978 [JP] Japan...53-72654--.

Signed and Sealed this

Twenty-second Day of September, 1992

Attest:

DOUGLAS B. COMER

*Attesting Officer*  *Acting Commissioner of Patents and Trademarks*